United States Patent
Lee et al.

(10) Patent No.: US 7,800,398 B2
(45) Date of Patent: Sep. 21, 2010

(54) SEMICONDUCTOR INTEGRATED CIRCUIT AND METHOD OF CONTROLLING THE SAME

(75) Inventors: Jun-Woo Lee, Ichon (KR); Kyung-Hoon Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 46 days.

(21) Appl. No.: 11/959,424

(22) Filed: Dec. 18, 2007

(65) Prior Publication Data

US 2008/0252332 A1 Oct. 16, 2008

(30) Foreign Application Priority Data

Apr. 11, 2007 (KR) .................. 10-2007-0035488

(51) Int. Cl.
 *H03K 17/16* (2006.01)
(52) U.S. Cl. .............................. 326/30; 326/26; 326/83
(58) Field of Classification Search .................. 326/26, 326/30, 81–83, 86–87, 21; 327/108–109
See application file for complete search history.

(56) References Cited

U.S. PATENT DOCUMENTS

| | | | |
|---|---|---|---|
| 6,928,007 B2 * | 8/2005 | Jin | 365/194 |
| 6,958,613 B2 | 10/2005 | Braun et al. | |
| 6,980,020 B2 | 12/2005 | Best et al. | |
| 7,138,823 B2 * | 11/2006 | Janzen et al. | 326/30 |
| 7,151,390 B2 | 12/2006 | Nguyen et al. | |
| 7,170,313 B2 | 1/2007 | Shin | |
| 7,176,711 B2 * | 2/2007 | Park et al. | 326/30 |
| 7,230,448 B2 * | 6/2007 | Choe | 326/30 |

FOREIGN PATENT DOCUMENTS

| | | |
|---|---|---|
| JP | 2005-285125 | 10/2005 |
| JP | 2006-129423 | 5/2006 |
| KR | 1020050012931 A | 2/2005 |
| KR | 100656461 B1 | 12/2006 |

* cited by examiner

*Primary Examiner*—James H. Cho
*Assistant Examiner*—Christopher Lo
(74) *Attorney, Agent, or Firm*—Baker & McKenzie LLP

(57) ABSTRACT

A semiconductor integrated circuit includes an ODT signal generator that receives an ODT command signal, an ODT reset signal, and an ODT calibration end signal to generate an ODT control signal according to the phase of the ODT calibration end signal, and an ODT resistance adjusting unit that is to perform an on-die termination operation in response to the ODT control signal.

15 Claims, 4 Drawing Sheets

SEMICONDUCTOR INTEGRATED CIRCUIT AND METHOD OF CONTROLLING THE SAME

CROSS-REFERENCE TO RELATED APPLICATION

This application claims priority from Korean Patent Application No. 10-2007-0035488 filed on Apr. 11, 2007 in the Korean Intellectual Property Office, the disclosure of which is incorporated herein by reference in its entirety.

BACKGROUND OF THE INVENTION

1. Technical Field

The present invention relates to a semiconductor integrated circuit, and in particular, to an on-die termination circuit.

2. Related Art

In recent years, due to a high operation speed of electronic devices, the swing width of a signal is reduced in order to minimize a transmission time of an interface signal between semiconductor apparatuses. As the swing width of the signal is reduced, an influence on external noise increases. That is, when a signal transmitted through a bus line having predetermined impedance passes through a bus line having different impedance, the signal may be partially reflected and then lost. This phenomenon is called impedance mismatching, and an impedance matching circuit for two bus lines is called an on-die termination (hereinafter, referred to as "ODT") circuit.

Further, resistance may be changed due to a change in process, voltage, and temperature (hereinafter, referred to as "PVT"). Accordingly, it is important that impedance is stable regardless of the change in PVT. Therefore, during the operation of the ODT circuit, calibration is needed to make resistance uniform.

The calibration may be needed in a power-up and an initialization period during an initial operation of the semiconductor integrated circuit or in an auto-refresh period due to a change in temperature. During the calibration operation, the ODT resistor unit is repeatedly activated and inactivated while the resistance value of the ODT circuit is adjusted, thereby realizing optimum resistance. In particular, during the initial operation of the semiconductor integrated circuit, the resistance value of the ODT circuit is usually adjusted many times. Accordingly, it takes a lot of time to perform the calibration due to the repetition of activation and inactivation of the ODT resistor unit. Further, while the ODT resistor unit is repeatedly activated and inactivated, a large amount of current may be consumed.

SUMMARY OF THE INVENTION

Embodiments of the invention provide a semiconductor integrated circuit that reduces the calibration time of ODT resistance.

Further, another embodiment of the invention provides a method of controlling a semiconductor integrated circuit that reduces the calibration time of ODT resistance.

According to an embodiment of the present invention, a semiconductor integrated circuit includes an ODT signal generator that generates an ODT control signal in response to an ODT command signal, an ODT reset signal, and an ODT calibration end signal, and ODT resistance adjusting unit that performs an on-die termination operation in response to the ODT control signal.

According to another embodiment of the present invention, a semiconductor integrated circuit includes an ODT signal generator that receives an ODT command signal, an ODT reset signal, and an ODT calibration end signal to generate an ODT control signal according to the ODT calibration end signal, which is activated if a prescribed number of ODT resistance adjustments is satisfied, an ODT resistor unit that has at least one internal resistor, receives the ODT control signal to provide a voltage divided by the internal resistor with respect to an external reference resistor, a voltage comparator that compares the voltage divided by the internal resistor with a reference voltage, a pulse generator that receives the ODT control signal to provide a comparator control signal for activating the voltage comparator, and an ODT resistance counter that adjusts the resistance value of the internal resistor in response to the output signal of the voltage comparator.

Still another embodiment of the invention provides a semiconductor integrated circuit including an ODT signal generator that generates an ODT control signal in response to an ODT command signal and an ODT reset signal, an ODT signal level maintaining unit that maintains the signal level of the ODT control signal when a prescribed number of ODT resistance adjustments is satisfied, and an ODT resistance adjusting unit that performs an on-die termination operation in response to an ODT control signal.

Yet still another embodiment of the invention provides a method of controlling a semiconductor integrated circuit, the method including generating an ODT command signal, generating an ODT reset signal with a time delay from the ODT command signal for a predetermined time, determining whether or not an ODT calibration end signal is activated, and generating an ODT control signal, which is activated by the ODT command signal to maintain a previous signal level during a period in which the ODT calibration end signal is inactivated

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF EXEMPLARY EMBODIMENT

The attached drawings for illustrating preferred embodiments of the present invention are referred to in order to gain a sufficient understanding of the present invention, the merits thereof, and the objectives accomplished by the implementation of the present invention.

Hereinafter, an exemplary embodiment of the invention will be described with reference to the accompanying drawings.

An exemplary embodiment of the present invention provides a semiconductor integrated circuit that can reduce a calibration time of ODT resistance. In particular, during a period in which an ODT calibration end signal is inactivated, a control is performed such that an ODT control signal can be continuously activated. Accordingly, while the ODT calibration end signal is inactivated, repetitive activation and inactivation of an ODT resistor unit is not performed. Therefore, the calibration time of ODT resistance can be reduced. Further, current consumption can be reduced.

A semiconductor integrated circuit and a method of controlling the same will now be described in detail.

Figure 1:
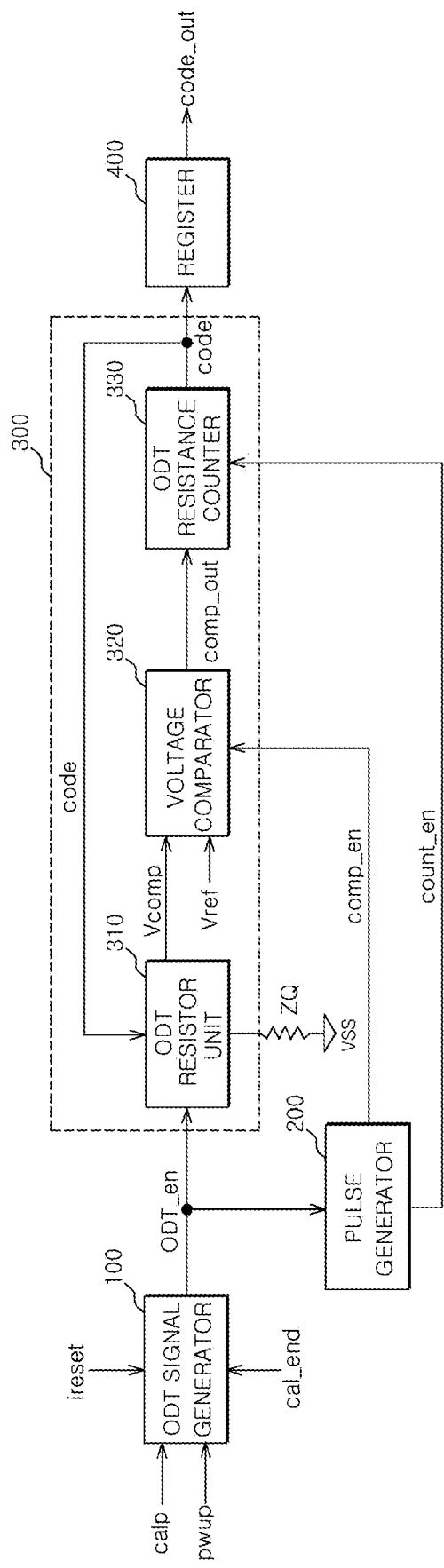
FIG. 1 is a block diagram of a semiconductor integrated circuit according to an embodiment of the present invention.

Referring to FIG. 1, the semiconductor integrated circuit according to an embodiment of the invention includes an ODT signal generator 100, a pulse generator 200, an ODT resistance adjusting unit 300, and a register 400.

First, the ODT signal generator 100 receives an ODT command signal calp, an ODT reset signal ireset, a power-up signal pwup, and an ODT calibration end signal cal_end. Then, the ODT signal generator 100 provides an ODT control signal ODT_en that is to activate a calibration operation when calibration is needed. The ODT signal generator 100 according to an embodiment of the invention can control the ODT control signal ODT_en according to the phase of the ODT calibration end signal cal_end. Therefore, during a period in which the ODT calibration end signal cal_end is inactive, the ODT signal generator 100 provides the ODT control signal ODT_en that is continuously activated without responding to the ODT reset signal ireset. Here, the ODT calibration end signal cal_end is a signal that is activated when the calibration operation of the semiconductor integrated circuit starts and a prescribed number ($2^n$) of ODT resistance adjustments is satisfied. The details of the ODT signal generator 100 will be described below.

The pulse generator 200 receives the ODT control signal ODT_en and supplies a comparator control signal comp_en and an ODT resistance counter control signal count_en. Here, the comparator control signal comp_en is a signal that can activate a voltage comparator 320. Further the ODT resistance counter control signal count_en is a signal that can activate an ODT resistance counter 330. In general, the comparator control signal comp_en is a pulse signal that is triggered at a rising edge of the ODT control signal ODT_en, but is supplied with a time delay for a predetermined time. As described above, according to an embodiment of the invention, during the period in which the ODT calibration end signal cal_end is inactive, the ODT signal generator 100 may provide the ODT control signal ODT_en that is continuously activated. Then, the comparator control signal comp_en can be triggered and supplied at the 'first' rising edge of the ODT control signal ODT_en only. That is, the fact that the ODT control signal ODT_en is continuously activated means that the rising edge of the ODT control signal ODT_en is generated only one time. Accordingly, the comparator control signal comp_en does not require a predetermined delay time from the rising edge of the ODT control signal ODT_en in order to provide a stable operation. Then, the first pulse of the comparator control signal comp_en is triggered at the rising edge of the ODT control signal ODT_en, and the subsequent pulses of the comparator control signal comp_en are generated at a pulse cycle corresponding to a minimum pulse width. Therefore, during the period in which the ODT calibration end signal cal_end is inactivated, the pulse cycle of the comparator control signal comp_en may be shorter than the pulse cycle during a period in which the ODT calibration end signal cal_end is activated. As a result, it is possible to reduce a calibration time during the period in which the ODT calibration end signal cal_end is inactivated.

The ODT resistance adjusting unit 300 includes an ODT resistor unit 310, a voltage comparator 320, and an ODT resistance counter 330.

The ODT resistor unit 310 has at least one internal resistor that divides a voltage in connection with an external reference resistor ZQ. The ODT resistor unit 310 receives the activated ODT control signal ODT_en to supply a voltage Vcomp divided by the internal resistor. The ODT resistor unit 310 activates or inactivates the internal resistor in response to an adjustment code signal code to be thereafter feed back, such that predetermined ODT resistance based on the external reference resistor ZQ can be realized.

The voltage comparator 320 compares the Vcomp divided by the internal resistor with a reference voltage Vref to provide a voltage comparison signal comp_out. As described above, the voltage comparator 320 is activated by the activated comparator control signal comp_en.

The ODT resistance counter 330 is activated by the ODT resistance counter control signal count_en to provide an adjustment code signal code in response to the voltage comparison signal comp_out. Here, the adjustment code signal code is a signal that can adjust resistance of the ODT resistor unit 310. When the number of resistors in the ODT resistor unit 310 is n, an n-bit adjustment code signal code having $2^n$ codes may be supplied. That is, the ODT resistance counter 330 receives the voltage comparison signal comp_out to provide the adjustment code signal code feedback to the ODT resistor unit 310 by incrementing or decrementing one bit. Accordingly, during calibration, the desired ODT resistance may be finely adjusted.

The register 400 receives the final adjustment code signal code to store and supply a calibrated final resistance value as a final code signal code_out.

Figure 2:
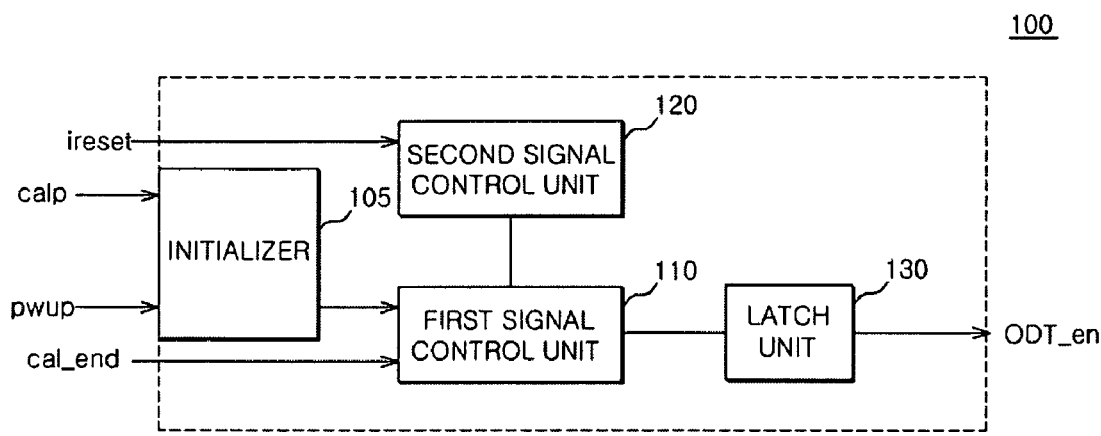
FIG. 2 is a schematic block diagram of an ODT signal generator shown in FIG. 1.

Referring to FIG. 2, the ODT signal generator 100 includes an initializer 105, a first signal control unit 110, a second signal control unit 120, and a latch unit 130.

The initializer 105 receives the power-up signal pwup and the ODT command signal calp. Then, the initializer 105 initializes the ODT signal generator 100 according to the phase of the power-up signal pwup or operates in response to the ODT command signal calp.

The first signal control unit 110 connects or disconnects a signal path of the second signal control unit 120 in response to the ODT calibration end signal cal_end to control the ODT control signal ODT_en. As described above, the ODT calibration end signal cal_end is a signal that is activated if the prescribed number ($2^n$) of ODT resistance adjustments is satisfied. Further, the prescribed number ($2^n$) of ODT resistance adjustments can vary according to the number (n) of resistors of the ODT resistor unit 310 shown in FIG. 1. The ODT calibration end signal cal_end is inactivated until the prescribed number of ODT resistance adjustments is satisfied, and thus the first signal control unit 110 is inactivated, thereby disconnecting the signal path of the second signal control unit 120. However, if the prescribed number of ODT resistance adjustments is satisfied, and the ODT calibration end signal cal_end is active, the first signal control unit 110 is activated, thereby connecting the signal path of the second signal control unit 120. Meanwhile, the ODT calibration end signal cal_end is continuously activated after the prescribed number of ODT resistance adjustments is satisfied. Therefore, after the ODT calibration end signal cal_end is activated, the first signal control unit 110 does not disconnect the signal path of the second signal control unit 120.

According to an embodiment of the invention, a case where the first signal control unit 110 is provided in the ODT signal generator 100 to connect or disconnect the signal path of the second signal control unit 120 has been described. However, the invention is not limited thereto. Various modifications can be made without departing from the scope of the invention. For example, the first signal control unit 110 maybe provided outside the ODT signal generator 100 to control the ODT signal generator 100. In this case, according to the configuration of the semiconductor integrated circuit, the first signal control unit 110 provided outside the ODT signal generator 100 may maintain the signal level of the ODT control signal ODT_en at a high level until the prescribed number of ODT resistance adjustments is satisfied.

The second signal control unit 120 is connected in series to the first signal control unit 110 to control the ODT control signal ODT_en in response to the ODT reset signal ireset. As described above, the signal path of the second signal control unit 120 is disconnected by the first signal control unit 110 during the period in which the ODT calibration end signal cal_end is inactivated. Thereafter, during a period in which the ODT calibration end signal cal_end is activated, calibration may be needed. For example, auto-refresh may be performed according to a change in temperature. In this case, the second signal control unit 120 responds to the ODT reset signal ireset and supplies the ODT control signal ODT_en through the first signal control unit 110.

The latch unit 130 latches a signal from the first and second signal control units to supply the latched signals as the ODT control signal ODT_en.

Figure 3:
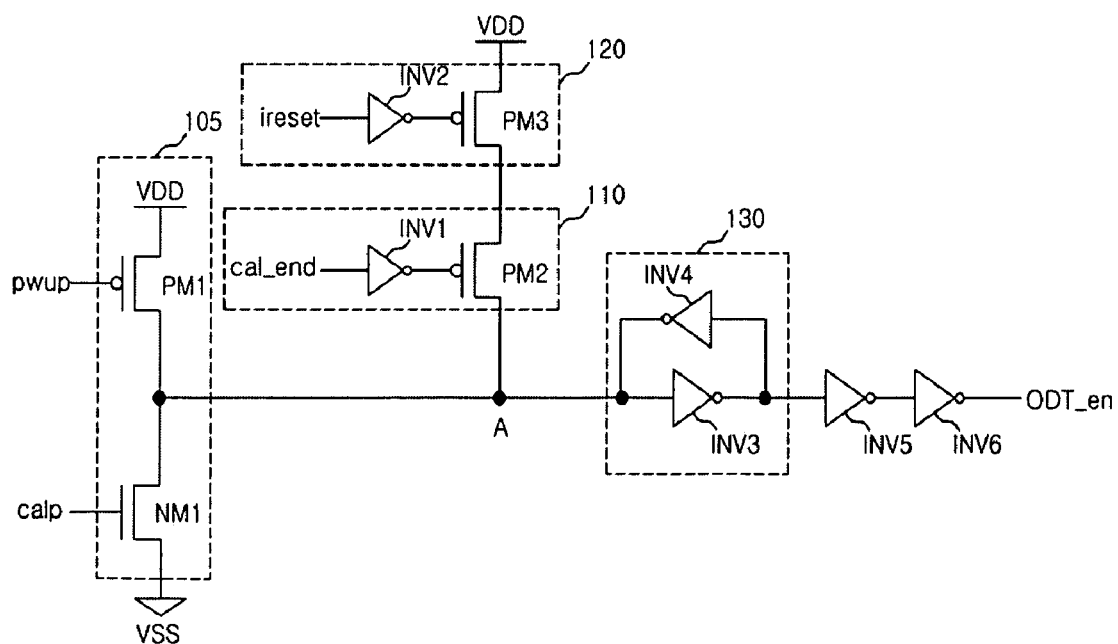
FIG. 3 is a detailed circuit diagram of an ODT signal generator shown in FIG. 2.

Referring to FIG. 3, the initializer 105 receives the power-up signal pwup and the ODT command signal calp for determining whether or not to calibrate the ODT resistance adjusting unit 300. The initializer 105 includes a first PMOS transistor PM1 and a first NMOS transistor NM1. The first PMOS transistor PM1 has a gate which receives the power-up signal pwup, a source connected to a power supply voltage VDD, and a drain connected to a drain of the first NMOS transistor NM1. The first NMOS transistor NM1 has a gate, which receives the ODT command signal calp, and a source connected to a ground voltage VSS. The power-up signal pwup is initially at a low level, but gradually increases to a predetermined power level to become a high level. The ODT command signal calp is a pulse signal that is generated when calibration is needed.

The first signal control unit 110 includes a first inverter INV1 and a second PMOS transistor PM2. The first inverter INV1 of the first signal control unit 110 receives the ODT calibration end signal cal_end. The second PMOS transistor PM2 has a gate, which receives the output signal of the first inverter INV1, and a source connected to a node A. The ODT calibration end signal cal_end is activated at a high level when the prescribed number (2") of ODT resistance adjustments is satisfied. That is, the ODT calibration end signal cal_end is inactivated at a low level until the prescribed number of ODT resistance adjustments is satisfied.

The second signal control unit 120 includes a second inverter INV2 and a third PMOS transistor PM3. The second inverter INV2 of the second signal control unit 120 receives the ODT reset signal ireset. The third PMOS transistor PM3 has a gate, which receives the output signal of the second inverter INV2, and a drain connected to the first signal control unit 110. The ODT reset signal ireset resets the calibration operation of the ODT resistor unit 310 (see FIG. 1). That is, the ODT reset signal ireset can inactivate the ODT resistor unit 310 (see FIG. 1).

The latch unit 130 has two inverters INV3 and INV4 cross-connected to each other, and one end thereof is connected to the node A. The latch unit 130 inverts and latches the output signal from the first and second signal control units 110 and 120 to stably supply the signal.

The operation of the semiconductor integrated circuit according to an embodiment of the invention will be described with reference to FIG. 3.

During the initial operation of the semiconductor integrated circuit, calibration is needed. Therefore an internally activated ODT command signal calp is generated. At this time, since the first power-up signal pwup is at a low level, the first PMOS transistor PM1 is turned on and the node A becomes a high level. Accordingly, the inactivated ODT control signal ODT_en at a low level is supplied. If the power-up signal pwup gradually becomes a high level, the first PMOS transistor PM1 is turned off, then the ODT command signal calp at a high level is received, and subsequently the first NMOS transistor NM1 is turned on. Therefore, the node A becomes a low level.

However, the ODT calibration end signal cal_end is inactivated at the low level until the prescribed number (2") of ODT resistance adjustments is satisfied. Accordingly, the first signal control unit 110 is inactivated. Meanwhile, even if the ODT command signal calp is generated and the ODT reset signal ireset is generated after a predetermined time, the signal path of the second signal control unit 120 is disconnected by the first signal control unit 110 during the period in which the ODT calibration end signal cal_end is inactivated. Therefore, the node A is still at the low level to provide the ODT control signal ODT_en activated at the high level through the latch unit 130 and the inverters INV5 and INV6.

If the ODT command signal calp is changed to the low level, and the first NMOS transistor NM1 is turned off. Then the latch unit 130 inverts the low level of the node A and latches the inverted level, such that the activated ODT control signal ODT_en may be supplied. That is, during a period in which the ODT calibration end signal cal_end is at the low level, the ODT control signal ODT_en that is continuously active can be supplied.

If the prescribed number of ODT resistance adjustments is satisfied, and the ODT calibration end signal cal_end is activated at the high level, the first signal control unit 110 is activated. Then, the signal path of the second signal control unit 120 can be connected. When calibration is needed after the ODT calibration end signal cal_end becomes the high level, the ODT control signal ODT_en can be inactivated in response to the ODT reset signal ireset.

Specifically, if the ODT command signal calp is generated as a pulse signal, the first NMOS transistor NM1 is turned on, and the node A becomes the low level. Accordingly, the ODT control signal ODT_en is activated at the high level, and thus the ODT resistor unit 310 (see FIG. 1) is activated, thereby adjusting resistance. Subsequently, the ODT reset signal ireset is generated with a time delay from the ODT command signal calp for a predetermined time. Then, the third PMOS transistor PM3 is turned on, and a signal at a power supply voltage level VDD is transmitted to the node A through the first signal control unit 110. Then, the ODT control signal ODT_en is inactivated by the activated ODT reset signal ireset, and thus a resistance adjustment operation of the ODT resistor unit stops.

In FIG. 1, the ODT resistor unit 310 is activated by the ODT command signal calp, and inactivated by the ODT reset signal ireset, which is generated when a predetermined time lapses from the ODT command signal calp. It takes a lot of time to change the ODT resistor unit 310 from activation to inactivation. In particular, during the initial operation of the semiconductor integrated circuit, many steps, such as activation and inactivation of the ODT resistor unit and the like, need to be repeated in order to adjust ODT resistance.

Accordingly, a large calibration time may be required in the power-up and the initialization period, and excessive current may flow.

In contrast, according to an embodiment of the invention, the first signal control unit 110 is provided to disconnect a path, in which the ODT control signal ODT_en is controlled by the ODT reset signal ireset, during the period in which the ODT calibration end signal cal_end is at the low level. In other words, until the prescribed number ($2^n$) of ODT resistance adjustments is satisfied, the ODT calibration end signal cal_end maintains the low level. Accordingly, the repetitive change operation of the ODT control signal ODT_en can be suppressed. Subsequently, if the ODT calibration end signal cal_end becomes the high level, the ODT resistor unit 310 (see FIG. 1) can be controlled by the ODT reset signal ireset.

Hereinafter, the operation of a semiconductor integrated circuit according to an embodiment of the invention will be described with reference to FIGS. 1 to 4.

During periods from t0 to t4 on a time axis, the ODT calibration end signal cal_end is inactivated at the low level.

First, the period from t0 to t1 will be described.

During a period in which calibration is needed, the ODT command signal calp is generated as a pulse signal. The ODT control signal ODT_en is activated in synchronization with the ODT command signal calp. The ODT calibration end signal cal_end maintains the low level until the prescribed number of ODT resistance adjustments is satisfied.

The ODT reset signal ireset is generated with a time delay from the ODT command signal calp. However, the ODT control signal ODT_en is not inactivated by the ODT reset signal ireset. As described above, while the ODT calibration end signal cal_end maintains the low level, the ODT control signal ODT_en does not respond to the ODT reset signal ireset.

The period from t1 to t2 will be described.

The comparator control signal comp_en is triggered at the rising edge of the ODT control signal and is generated with a time delay for a predetermined time Δt. The comparator control signal comp_en is a signal that activates the comparator to compare resistance of the ODT resistor unit. A predetermined time Δt is required until the ODT resistor unit is activated and stabilized. Accordingly, the comparator control signal comp_en is generated after the predetermined time Δt lapses from when the ODT control signal ODT_en is activated.

The period from t2 to t3 will be described.

The ODT signal generator 100 according to an embodiment of the invention can maintain the ODT control signal ODT_en at the high level in the power-up and initialization periods until the ODT calibration end signal cal_end becomes the high level. Accordingly, the comparator control signal comp_en is triggered at the rising edge of the ODT control signal ODT_en, particularly, at only the first rising edge. Then, during the period from t2 to t3, the comparator control signal comp_en is generated according to the pulse cycle with no time delay (Δt), thereby significantly reducing time.

The period from t3 to t4 will be described.

If the number of resistance adjustments in the power-up and initialization periods is satisfied, the ODT calibration end signal cal_end is changed to the high level. It can be seen that, after the time t3, the ODT calibration end signal cal_end continues to maintain the high level. The ODT control signal ODT_en is changed to the low level in synchronization with the ODT reset signal ireset after the ODT calibration end signal cal_end becomes the high level. If the prescribed number of ODT resistance adjustments is satisfied, and the ODT calibration end signal cal_end becomes the high level, the ODT control signal ODT_en can be inactivated by the ODT reset signal ireset.

Therefore, a control is performed such that the ODT control signal ODT_en is activated during the period in which the ODT calibration end signal cal_end is inactivated, thereby reducing power consumption. Further, since the comparator control signal comp_en is generated at a short pulse cycle in synchronization with the ODT control signal ODT_en, the ODT calibration time can be reduced.

Figure 4:
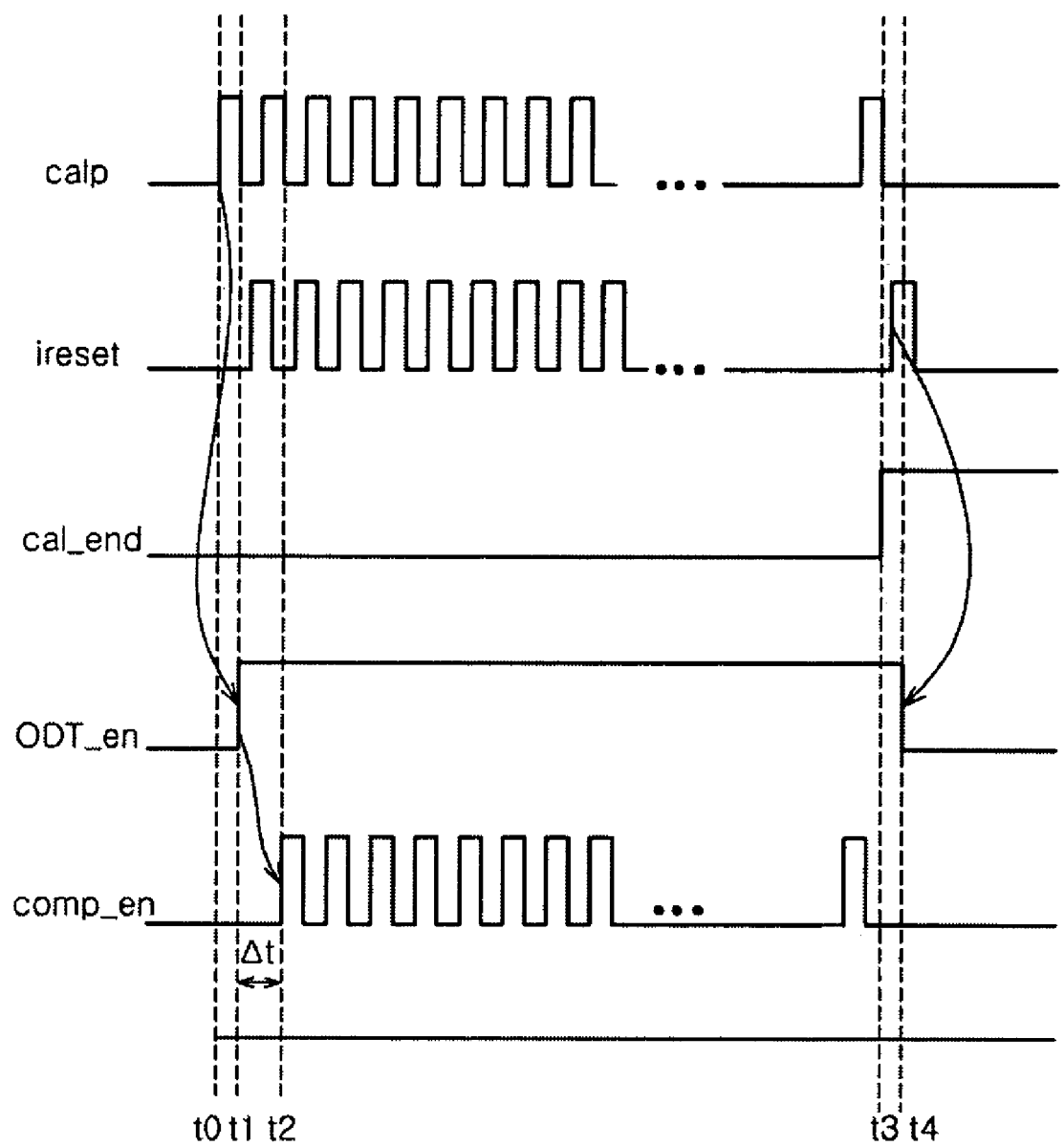
FIG. 4 is a timing chart showing the operation of a semiconductor integrated circuit according to an embodiment of the present invention.
Figure 5:
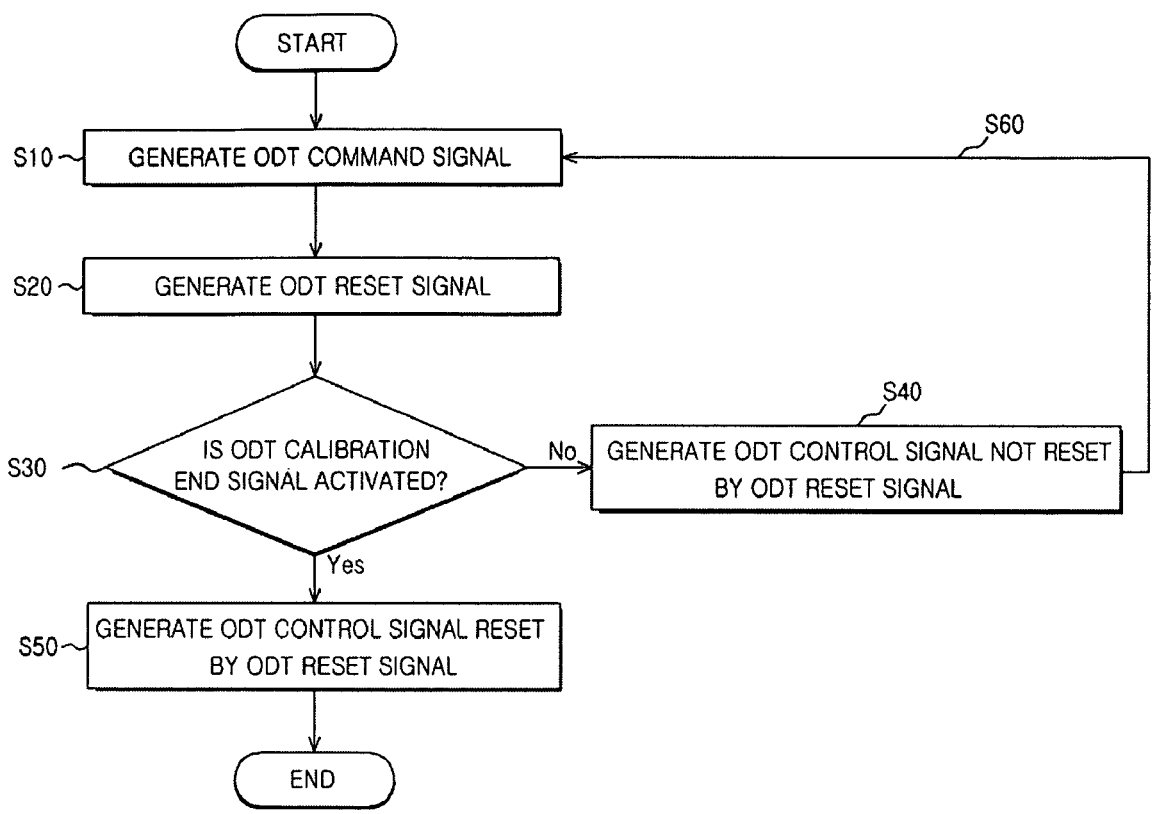
FIG. 5 is a flowchart showing a method of controlling a semiconductor integrated circuit according to an embodiment of the present invention.

FIG. 5 is a flowchart showing a method of controlling a semiconductor integrated circuit in a power-up period and an initialization period according to an embodiment of the invention. A method of controlling a semiconductor integrated circuit according to an embodiment of the invention will be described with reference to FIGS. 4 and 5.

The ODT command signal calp is generated (Step S10).

When calibration of ODT resistance is needed, a command signal for adjusting ODT resistance is generated. The ODT control signal ODT_en can be activated in synchronization with the ODT command signal calp.

The ODT reset signal ireset is generated with a time delay from the ODT command signal calp (Step S20).

The ODT reset signal ireset may inactivate the ODT control signal ODT_en.

It is determined whether or not the ODT calibration end signal cal_end is activated (Step S30).

That is, it is determined whether or not the prescribed number of ODT resistance adjustments to adjust ODT resistance is satisfied. If the prescribed number of ODT resistance adjustments is satisfied, the ODT calibration end signal cal_end is activated at the high level.

During the period in which the ODT calibration end signal cal_end is inactivated, the ODT control signal ODT_en that is activated by the ODT command signal calp and is not reset by the ODT reset signal ireset is generated (Step S40).

Specifically, in the providing of the ODT control signal ODT_en, the signal path is disconnected not to respond to the ODT reset signal ireset during the period in which the ODT calibration end signal cal_end is inactivated. That is, during the period in which the ODT calibration end signal cal_end is inactivated, the ODT control signal ODT_en responds to the ODT calibration end signal cal_end. As described above, the ODT calibration end signal cal_end is activated if the prescribed number of ODT resistance adjustments is satisfied.

During a period in which the ODT calibration end signal cal_end is activated, the ODT control signal ODT_en that is reset by the ODT reset signal ireset is generated (Step S50).

Specifically, during the period in which the ODT calibration end signal cal_end is activated, the ODT control signal ODT_en that is activated by the ODT command signal calp and inactivated by the ODT reset signal ireset is generated. That is, during the period in which the ODT calibration end signal cal_end is activated, the signal path is connected to respond to the ODT reset signal ireset, such that the ODT control signal ODT_en can be reset by the ODT reset signal ireset.

Though not shown in FIG. 4, the ODT control signal ODT_en is received to provide a voltage divided by the internal resistor in the ODT resistor unit with respect to the external reference resistor. The ODT resistor unit may have a plurality of internal resistors. With the internal resistor, ODT resistance based on the external reference resistor can be realized. Then, the voltage divided by the internal resistor is compared with the reference voltage, to provide the voltage comparison signal. Specifically, the voltage divided by the internal resistor is compared with the reference voltage to provide the difference as the voltage comparison signal. Subsequently, the resistance value of the internal resistor is adjusted in response to the voltage comparison signal. That is, the adjustment code signal corresponding to the voltage comparison signal is fed back to the ODT resistor unit, thereby activating or inactivating the internal resistor of the ODT resistor unit.

Steps S10 to S40 are repeated until the ODT calibration end signal cal_end is activated (Step S60).

According to the semiconductor integrated circuit and the method of controlling the same of an embodiment of the invention, the control is performed such that the ODT control signal ODT_en is continuously active until the ODT calibration end signal cal_end is activated. Therefore, power consumption may be reduced, and the ODT resistance calibration time may be reduced.

Although the invention has been described in detail by way of the exemplary embodiment, the invention is not limited to the embodiment. It will be apparent to those skilled in the art that various modifications and changes may be made without departing from the scope and spirit of the invention. As described above, according to the semiconductor integrated circuit and the method of controlling the same of the embodiment of the invention, the path of the ODT reset signal is disconnected such that the ODT control signal is continuously activated until the ODT calibration end signal is activated. Therefore, the ODT resistance calibration time may be reduced. In addition, power consumption may be reduced.

What is claimed is:

1. A semiconductor integrated circuit comprising:
an ODT signal generator that generates an ODT control signal in response to an ODT command signal, an ODT reset signal, and an ODT calibration end signal;
an ODT resistance adjusting unit that performs an on-die termination operation in response to the ODT control signal; and
a pulse generator that receives the ODT control signal to provide a comparator control signal to the ODT resistance adjusting unit,
wherein a pulse cycle of the comparator control signal during inactivation of the ODT calibration end signal is shorter than a pulse cycle of the comparator control signal during a period in which the ODT calibration end signals activated.

2. The semiconductor integrated circuit of claim 1,
wherein the ODT signal generator comprises:
a first signal control unit that performs a switching operation in response to the ODT calibration end signal; and
a second signal control unit that is connected in series to the first signal control unit to perform a reset operation of the ODT control signal in response to the ODT reset signal,
wherein the first signal control unit disconnects or connects a signal path of the second signal control unit.

3. The semiconductor integrated circuit of claim 1, wherein the ODT resistance adjusting unit repeatedly adjusts ODT resistance with a prescribed number of adjustments, and the ODT calibration end signal is activated if the prescribed number of adjustments is satisfied.

4. The semiconductor integrated circuit of claim 2,
wherein, if the ODT calibration end signal is inactivated, the first signal control unit is configured to disconnect the signal path of the second signal control unit.

5. The semiconductor integrated circuit of claim 2,
wherein, if the ODT calibration end signal is activated, the first signal control unit is configured to connect the signal path of the second signal control unit.

6. The semiconductor integrated circuit of claim 5,
wherein, if the ODT calibration end signal is activated, and the ODT reset signal is activated, the second signal control unit resets the ODT control signal.

7. The semiconductor integrated circuit of claim 1,
wherein the ODT signal generator further comprises a latch unit that latches the ODT control signal.

8. A semiconductor integrated circuit comprising:
an ODT signal generator that receives an ODT command signal, an ODT reset signal, and an ODT calibration end signal to generate an ODT control signal according to the ODT calibration end signal, which is activated if a prescribed number of ODT resistance adjustments is satisfied;
an ODT resistor unit that has at least one internal resistor having a resistance value and that receives the ODT control signal to provide a voltage divided by the internal resistor with respect to an external reference resistor;
a voltage comparator that compares the voltage divided by the internal resistor with a reference voltage to provide an output signal;
a pulse generator that receives the ODT control signal to provide a comparator control signal for activating the voltage comparator; and
an ODT resistance counter that adjusts the resistance value of the internal resistor in response to the output signal of the voltage comparator,
wherein a pulse cycle of the comparator control signal is shorter during a period in which the ODT calibration end signal is inactivated than during a period in which the ODT calibration end signal is activated.

9. The semiconductor integrated circuit of claim 8,
wherein the ODT signal generator comprises:
a first signal control unit that performs a switching operation in response to the ODT calibration end signal; and
a second signal control unit that is connected in series to the first signal control unit to perform a reset operation of the ODT control signal in response to the ODT reset signal,
wherein the first signal control unit disconnects or connects a signal path of the second signal control unit.

10. The semiconductor integrated circuit of claim 8,
wherein the ODT resistor unit repeatedly adjusts ODT resistance a prescribed number of adjustments.

11. The semiconductor integrated circuit of claim 9,
wherein, if the ODT calibration end signal is inactivated, the first signal control unit disconnects the signal path of the second signal control unit.

12. The semiconductor integrated circuit of claim 9,
wherein, if the ODT calibration end signal is activated, the first signal control unit connects the signal path of the second signal control unit.

13. The semiconductor integrated circuit of claim 12,
wherein, if the ODT calibration end signal is activated, and the ODT reset signal is activated, the second signal control unit resets the ODT control signal.

14. The semiconductor integrated circuit of claim 8,
wherein the ODT signal generator further comprises a latch unit that latches the ODT control signal.

15. The semiconductor integrated circuit of claim 8,
wherein the comparator control signal is triggered at a rising edge of the ODT control signal with a time delay.

* * * * *